US007392880B2

(12) United States Patent
Buck

(10) Patent No.: US 7,392,880 B2
(45) Date of Patent: Jul. 1, 2008

(54) DUAL RANGE HORN WITH ACOUSTIC CROSSOVER

(75) Inventor: Marshall D. Buck, Los Angeles, CA (US)

(73) Assignee: Gibson Guitar Corp., Nashville, TN (US)

( * ) Notice: Subject to any disclaimer, the term of this patent is extended or adjusted under 35 U.S.C. 154(b) by 690 days.

(21) Appl. No.: 10/404,006

(22) Filed: Mar. 31, 2003

(65) Prior Publication Data

US 2004/0005069 A1 Jan. 8, 2004

Related U.S. Application Data

(60) Provisional application No. 60/369,423, filed on Apr. 2, 2002.

(51) Int. Cl.

| | |
|---|---|
| ***H04R 1/02*** | (2006.01) |
| ***H03G 5/00*** | (2006.01) |
| ***H05K 5/00*** | (2006.01) |
| ***G10K 13/00*** | (2006.01) |
| ***G10K 11/00*** | (2006.01) |

(52) U.S. Cl. ....................... 181/152; 381/337; 381/338; 381/98; 381/340; 381/99; 181/144; 181/159; 181/187; 181/192; 181/163; 181/145

(58) Field of Classification Search .................. 381/98, 381/99, 338, 337, 340, 336, 342, 356, 357; 181/187, 192, 152, 159, 163, 144–147, 175, 181/177, 179, 180, 185

See application file for complete search history.

(56) References Cited

U.S. PATENT DOCUMENTS

| | | | |
|---|---|---|---|
| 1,674,683 A | 6/1928 | Hahnemann | |
| 1,760,377 A | 5/1930 | Shaw | |
| 1,767,358 A | 6/1930 | Gottshall | |
| 1,907,723 A | 5/1933 | Bostwick | |
| 1,992,300 A | 2/1935 | Fanger | |
| 2,107,757 A | 9/1938 | Kinsley | |
| 2,269,284 A | 1/1942 | Olson | |
| 2,381,174 A | 8/1945 | Massa | 381/190 |
| 2,638,510 A | 5/1953 | Brami | |
| 2,822,884 A | 2/1958 | Simpson | |
| 3,065,816 A | 11/1962 | Ranger | |
| 3,814,857 A | 6/1974 | Thomasen | 381/99 |
| 3,862,366 A | 1/1975 | Huszty et al. | |
| 3,898,384 A | 8/1975 | Goeckel | |
| 4,174,019 A | 11/1979 | Kramer | |

(Continued)

OTHER PUBLICATIONS

AAPA, Fiugre 2, paragraph 0054.
AAPA, Figure 2, paragraph 0054.*
Frazier pamplet.
PCT Application No. PCT/1B98/00914 Feb. 4, 1999.
United Kingdom Patent No. 303,837 Mar. 6, 1930.
United Kingdom Patent No. 723,604 Feb. 9, 1955.
Japanese Patent No. 52-33517 Mar. 14, 1977.

*Primary Examiner*—Vivian Chin
*Assistant Examiner*—Devona Faulk
(74) *Attorney, Agent, or Firm*—Stroock & Stroock & Lavan LLP

(57) ABSTRACT

A new approach has been developed to combine mid-range and high frequency sound into the throat of a horn designed for sound reinforcement. An acoustic low pass filter element is interposed between the lower frequency passage and the higher frequency passage, so that a smooth combination of the two frequency bands is achieved at the entrance to the horn bell. Thus, each frequency band has nearly identical dispersion, and the two sources have equal delay.

22 Claims, 13 Drawing Sheets

U.S. PATENT DOCUMENTS

| | | | | |
|---|---|---|---|---|
| 4,227,051 A | | 10/1980 | Thomas et al. | |
| 4,256,930 A | | 3/1981 | Garner et al. | |
| 4,283,606 A | | 8/1981 | Buck | |
| 4,344,504 A | | 8/1982 | Howze | |
| 4,391,346 A | | 7/1983 | Murakami et al. | |
| 4,469,921 A | | 9/1984 | Kinoshita | |
| 4,524,846 A | | 6/1985 | Whitby | |
| 4,619,342 A | | 10/1986 | Buck | 181/184 |
| 4,629,029 A | | 12/1986 | Gunness | |
| 4,733,749 A | | 3/1988 | Newman et al. | |
| 4,836,327 A | | 6/1989 | Andrews et al. | |
| 4,845,759 A | | 7/1989 | Danley | |
| 4,882,562 A | | 11/1989 | Andrews et al. | |
| 4,885,782 A | | 12/1989 | Eberbach | |
| 4,923,031 A | | 5/1990 | Carlson | |
| 4,930,596 A | * | 6/1990 | Saiki et al. | 181/152 |
| 4,969,196 A | | 11/1990 | Nakamura | |
| 5,000,286 A | | 3/1991 | Crawford et al. | |
| 5,004,067 A | | 4/1991 | Patronis | |
| 5,020,630 A | | 6/1991 | Gunness | |
| 5,046,581 A | | 9/1991 | Mitchell | |
| 5,109,423 A | | 4/1992 | Jacobson et al. | |
| 5,526,456 A | | 6/1996 | Heinz | |
| 5,623,132 A | | 4/1997 | Gahm | |
| 5,715,322 A | * | 2/1998 | Yoshioka et al. | 381/182 |
| 5,892,183 A | | 4/1999 | Roozen et al. | |
| 6,095,279 A | | 8/2000 | Adamson | |
| 6,112,847 A | | 9/2000 | Lehman | |
| 6,118,883 A | | 9/2000 | Rocha | |
| 6,343,134 B1 | | 1/2002 | Czerwinski | |
| 2002/0014368 A1 | | 2/2002 | Adamson | 181/182 |
| 2002/0014369 A1 | * | 2/2002 | Engebretson | 181/199 |
| 2002/0014639 A1 | * | 2/2002 | Imai et al. | 257/227 |

* cited by examiner

DUAL RANGE HORN WITH ACOUSTIC CROSSOVER

This application claims the benefit of U.S. Provisional Patent Application Ser. No. 60/369,423 filed Apr. 2, 2002, entitled "Dual Range Horn with Acoustic Crossover", which is hereby incorporated by reference.

A portion of the disclosure of this patent document contains material that is subject to copyright protection. The copyright owner has no objection to the facsimile reproduction by anyone of the patent document or the patent disclosure, as it appears in the Patent and Trademark office patent file or records, but otherwise reserves all copyright rights whatsoever.

Be it known that I, Marshall D. Buck, a citizen of the United States, residing in Los Angeles, Calif. have invented a new and useful "Dual Range Horn With Acoustic Crossover."

BACKGROUND OF THE INVENTION

1. Field of the Invention

The present invention relates generally to the design of acoustic horns for use in a speaker system.

2. Description of the Prior Art

In the design of acoustic speaker systems, typically a combination of speakers is provided to optimize the performance of the speaker system in the low frequency ranges, mid-frequency ranges, and high frequency ranges. Thus, a conventional "three-way" speaker system will have individual speaker components addressing these three frequency ranges.

Several prior art attempts have been made to create a single speaker that produces sounds in multiple frequency ranges. For example, U.S. Pat. No. 5,526,456 issued to Heinz discloses a multiple driver single horn speaker. In Heinz, the high frequency and low frequency sound take parallel paths into the horn. However, the configuration of the Heinz loud speaker produces interference between the various frequencies as well as irregularities in the sound produced from the horn.

U.S. patent application publication Ser. No. 2002/0014369 by Engebretson discloses a multiple driver sound system. The Engebretson publication also fails to cure the interference and the irregularities between the frequencies because of the failure of the frequencies to promulgate through the same horn section.

Other attempts to solve these problems have resulted in sound drivers being placed coaxially. This topology has been used in an attempt to achieve a more uniform pattern control in a more compact system. For example, U.S. Pat. Nos. 4,283,606 and 4,619,342 both issued to Buck disclose a low frequency transducer and a high frequency transducer having coaxial acoustic centers. These prior art arrangements still suffer from three basic problems. First of all, the high frequency horn shadows the mid frequency sound, causing the response irregularities. Second, the unequal time delay between the two frequencies causes frequency response problems unless there is a specific delay correction applied. Finally, the directional coverage pattern produced from these prior art devices has significant peaks and dips at and near the crossover frequency at locations off the acoustical axis.

Thus, there is a continuing need in the art for an improved speaker system which would permit higher and lower frequencies sources to utilize a common horn.

SUMMARY OF THE INVENTION

A new approach has been developed to combine mid-range and high frequency sound into the throat of a horn designed for sound reinforcement. An acoustic low pass filter element is interposed between the lower frequency passage and the higher frequency passage, so that a smooth combination of the two frequency bands is achieved at the entrance to the horn bell. Thus, each frequency band has nearly identical dispersion, and the two sources have equal delay.

In one embodiment the invention provides a horn apparatus including a horn having a bell and an entrance slot, a higher frequency source, a lower frequency source, a higher frequency throat connecting the higher frequency source to the entrance slot of the horn, a lower frequency throat connecting the lower frequency source to the entrance slot of the horn, and an acoustic cross-over filter interposed between the higher frequency throat and the lower frequency throat upstream of the entrance slot of the horn.

Accordingly, it is an object of the present invention to provide an improved dual range horn apparatus with an acoustic crossover.

Another object is the provision of a dual range horn having a very symmetrical dispersion pattern across the entire frequency range covered by both transducers.

And another object of the present invention is the provision of a low pass filter which reduces harmonic distortion generated above the pass band of the lower frequency device, thus producing better sound quality.

Other and further object features and advantages of the present invention will be readily apparent to those skilled in the art upon a reading of the following disclosure when taken in conjunction with the accompanied drawings.

DETAILED DESCRIPTION OF THE PREFERRED EMBODIMENTS

Figure 1:
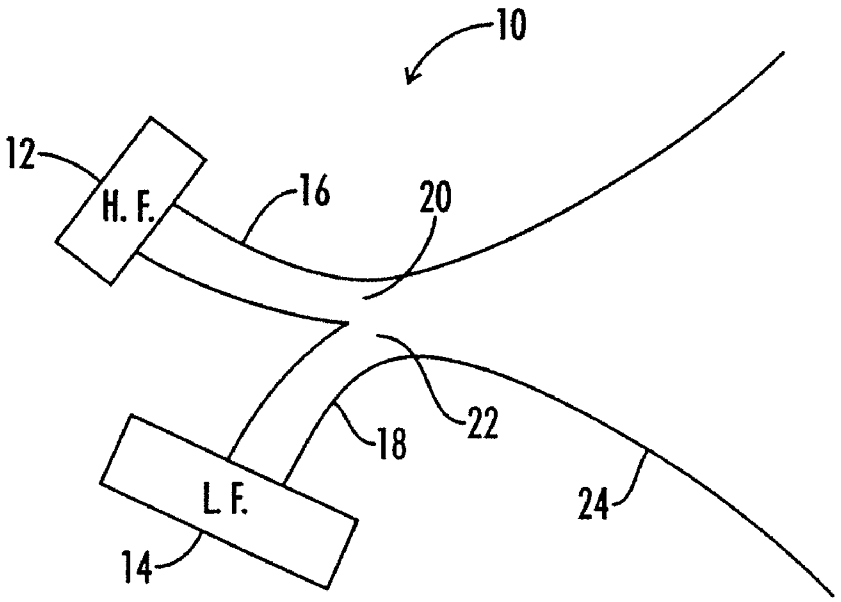
FIG. 1 PRIOR ART
FIG. 1 is a schematic sketch of a prior art device showing two acoustic transducers connected to parallel entrance slots of a horn.

FIG. 1 shows a prior art speaker system 10 having a high frequency acoustic transducer 12 and a low frequency acoustic transducer 14 which sends sound energy through high and low frequency throats 16 and 18 to parallel entrance slots 20 and 22 in the bell 24 of a horn. The difficulty with such an arrangement is that there will be an asymmetry in the sound distribution from the two sources 12 and 14, as they do not share a single entrance slot to the horn.

Figure 2:
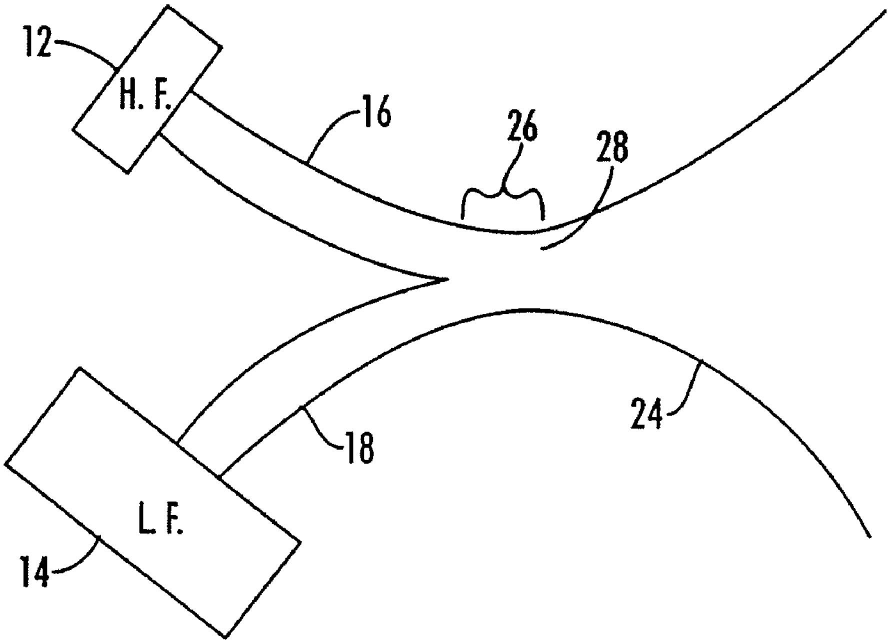
FIG. 2 PRIOR ART
FIG. 2 is a schematic sketch of prior art device wherein a combining section has been added upstream of a single entrance slot to the horn.

FIG. 2 shows a prior art arrangement wherein there is a combining section 26 for the two sources 12 and 14 before a single slot 28 to the horn bell 24. The problem with the arrangement of FIG. 2 is that if the sound sources are covering different frequency ranges, then the passage ways will not exhibit the desired exponential area increase as a function of distance, thus causing frequency response errors.

Figure 3:
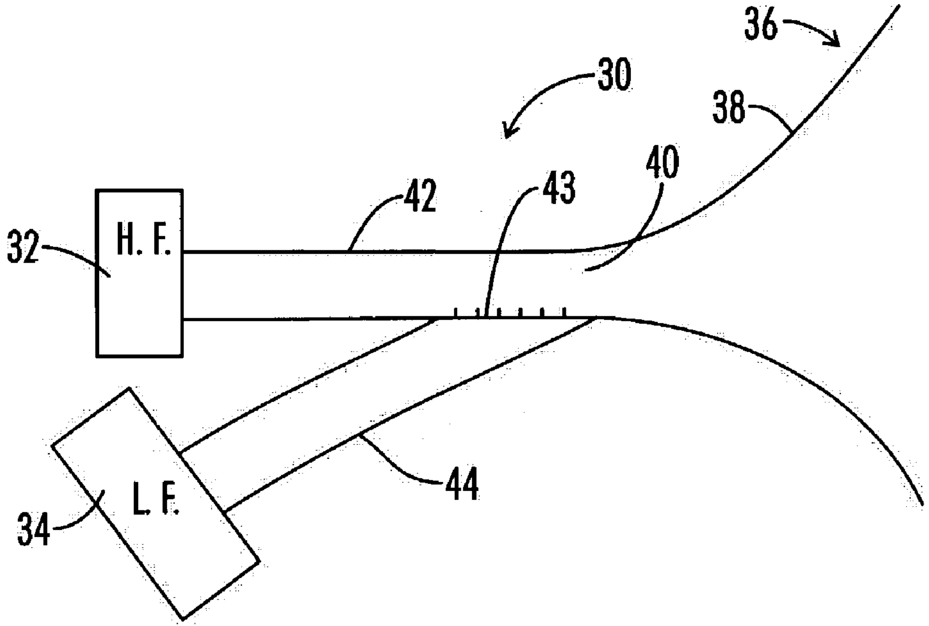
FIG. 3 is a schematic illustration of a first embodiment of the present invention having a high frequency source and a single low frequency source with a single perforated plate acoustic filter between the throat sections of the high frequency source and low frequency source. This embodiment is sometimes referred to as a "dual horn".

FIG. 3 shows one embodiment of a horn apparatus 30 of the present invention. The higher and lower frequency source acoustic transducers, which may be referred to as higher and lower frequency sources, are designated by the numerals 32 and 34, respectively. The lower frequency source 34 may be the "mid-range" speaker of a three-way speaker system. A horn 36 has a bell 38 which has a single entrance slot 40. A higher frequency throat section 42 communicates the higher frequency source 32 with inlet slot 40. An acoustic filter 43, which includes a perforated sheet, is interposed between the low and high frequency throat sections 44 and 42, just prior to joining the entrance slot 40 which enters the horn bell 38. The acoustic filter 43 is a low pass (high cut) filter of 20 dB per decade slope, which constitutes an acoustic crossover network. This allows each disparate horn throat 42 and 44 to have a proper exponential flare rate, while allowing the two sound sources 32 and 34 to combine at the horn bell entrance slot 40.

By way of illustration, if this perforated panel 43 were solid, then the higher frequency throat 42 would function normally, while the lower frequencies from throat 44 would be completely blocked. Instead, the filter 43 comprising the perforated plate, confines the higher frequencies to the higher frequency throat section 42 while allowing the lower frequencies to enter the higher frequency throat section 42 in a gradual manner. Thus the proper flare rates are preserved for each sound source.

The horn apparatus 30 of the present invention can also be called a dual range horn 30. In a preferred embodiment, the horn apparatus 30 includes the higher frequency throat section 42 centrally located so that the axis of the high frequency throat section 42 is perpendicular to the horn flange periphery. The lower frequency source 34 is placed at a 90 degree angle with respect to the higher frequency source 32. The low frequency throat section 44 is bent and arranged to engage the high frequency throat 42 at an angle.

The higher frequency throat 42 communicates openly with the entrance slot 40 of the horn 36. The acoustic filter 43 provides relatively high impedance to the higher frequency sounds. As such, the higher frequency energy is confined to the higher frequency throat 42. The lower frequency energy enters the higher frequency throat 42 from the side at an angle to the axis of the higher frequency throat 42. This lower frequency energy passes through the acoustic filter 43, which can also be called a low pass filter 43, to blend smoothly with the high frequency sound and the high frequency throat 42. The lower frequency energy encounters the entrance slot 40 of the horn 36 concurrently with the higher frequency energy. Thus each frequency band enters the horn 36 at nearly the same position, and the dispersing pattern is nearly identical for both frequency bands. This is due to the fact that all frequencies are directed and controlled by one bell 38 on a single horn 36.

The result is a very symmetrical dispersion pattern across the entire frequency range covered by both transducers 32 and 34. In addition, the low pass filter 43 reduces harmonic distortion generated above the passband of the lower frequency device, thus producing better sound quality. A further advantage of this arrangement is that the low and high frequency throat sections 44 and 42 are similar in length for each of the frequency sources 32 and 34. In the preferred embodiment this length is identical for each frequency source, resulting in an equal time delay for both frequency energies.

Figure 17:
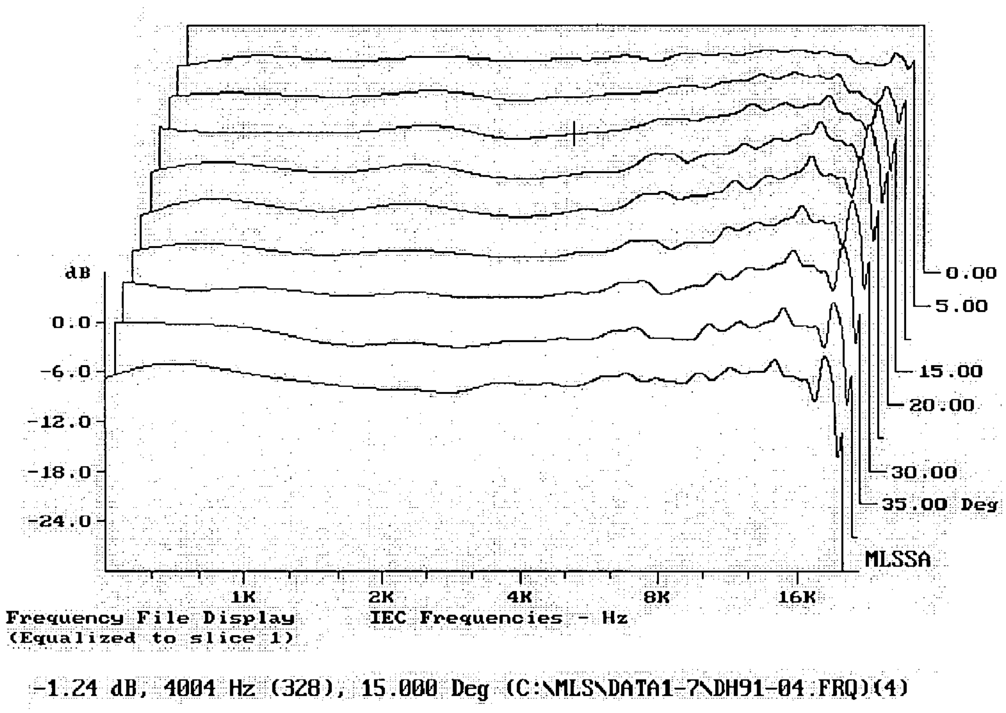
FIG. 17 is graphical representation of the horizontal dispersion of a horn assembly made in accordance with the current invention using a single driver for each frequency band-on a three frequency system.

As an example, FIG. 17 shows the horizontal dispersion of a horn assembly made in accordance with the current invention using a single driver for each frequency band on a three frequency system. The crossover point is quite seamless at four (4) kHz. Thus, the invention provides evenly controlled sound dispersion across a wide range of frequencies with a virtually undetectable crossover.

Figure 18:
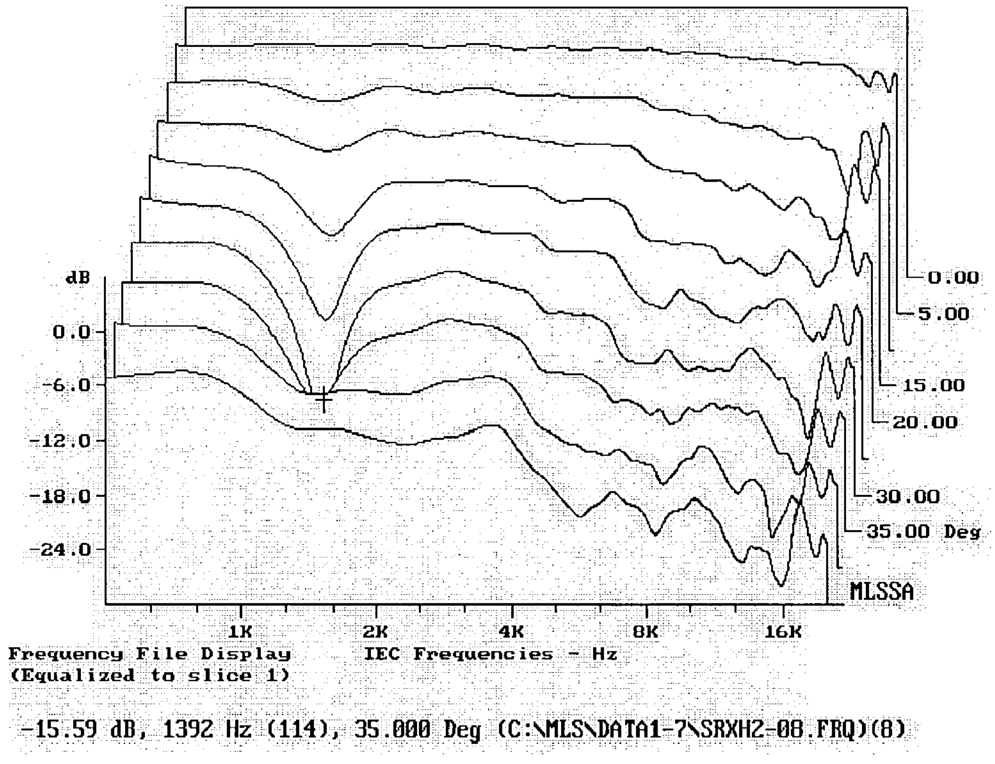
FIG. 18 is a graphical display of the mid and high frequency response as a function of horizontal angle for a conventionally spaced mid and high horns.

By way of comparison, FIG. 18 is a display of the mid and high frequency response as a function of horizontal angle for a conventionally spaced mid and high horns. FIG. 18 shows a conventional system using a side by side mid and high frequency horns over the same range of input as seen in FIG. 17. Due to the non-coincident nature of the side by side arrangement, the time delay between the dual frequency sources appears in this side by side arrangement when the output is reviewed at any point not exactly on the central axis of this conventional system. As a result, conventional systems have frequency response anomalies.

Figure 19:
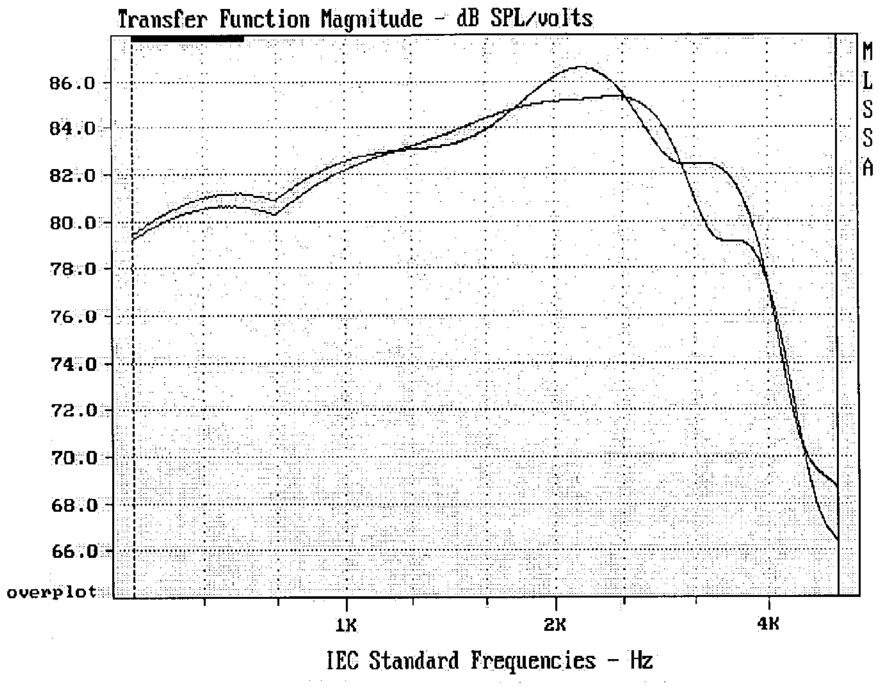
FIG. 19 is a graphical representation of the horizontal asymmetry remaining in the output from a horn assembly made according to this invention.

The current invention also reduces the left-right asymmetry. As seen in FIG. 19 the horizontal asymmetry remaining in the output from the current invention is minimal. Specifically, FIG. 19 shows the remaining midrange +/−45 degree horizontal asymmetry in the dual range horn with acoustic crossover. Note the improved horizontal asymmetry in a dual range horn apparatus created according to this invention.

Figure 4:
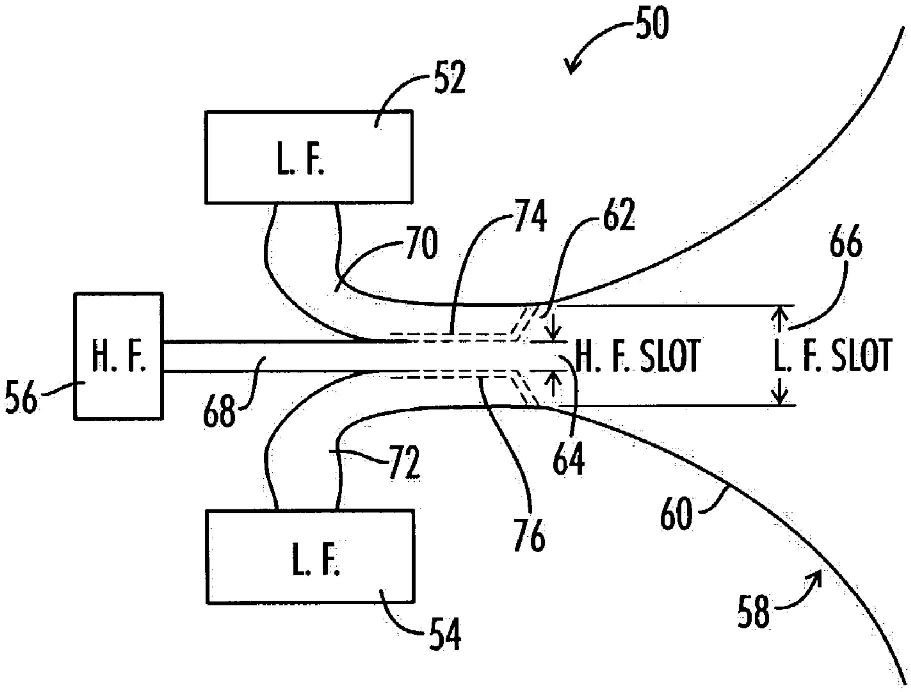
FIG. 4 is a schematic illustration of another embodiment of the present invention utilizing two low frequency sources and two perforated plate acoustic filters on opposite sides of a high frequency throat section, all leading to a common inlet slot of a horn. This embodiment is sometimes referred to as a "quad horn".
Figure 5:
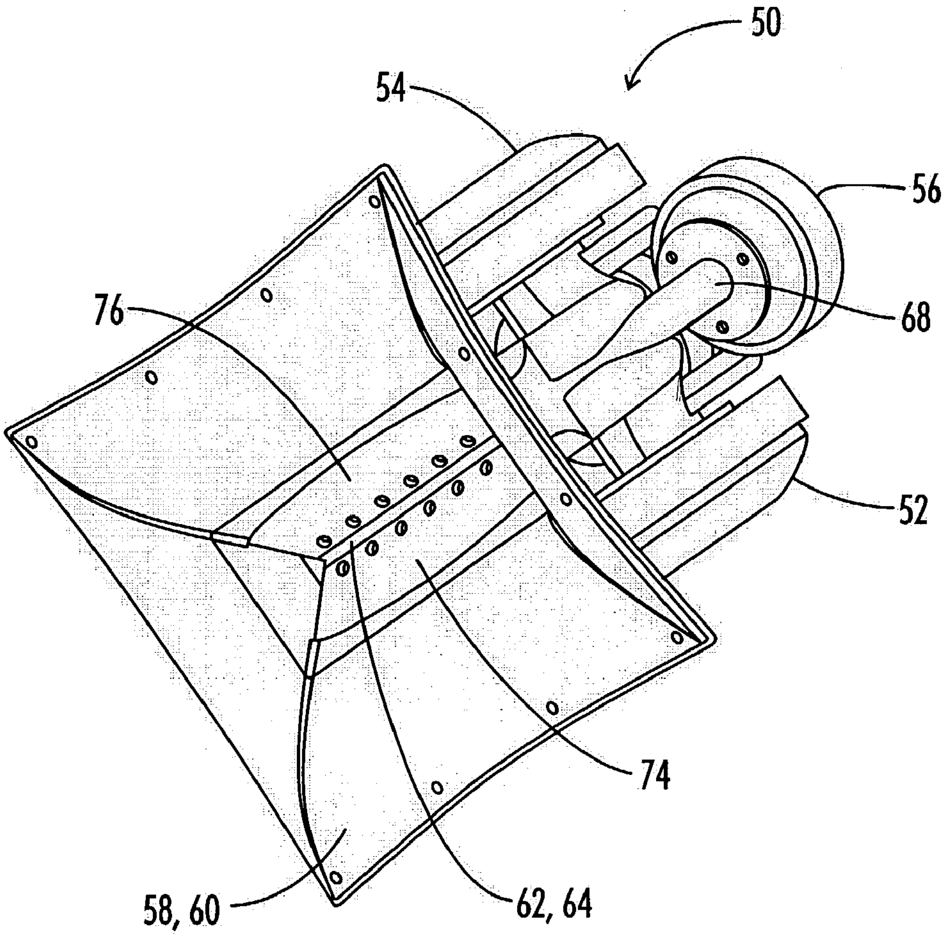
FIG. 5 is a perspective view of a quad horn that is a horn utilizing two higher frequency sources and two lower frequency sources.
Figure 6:
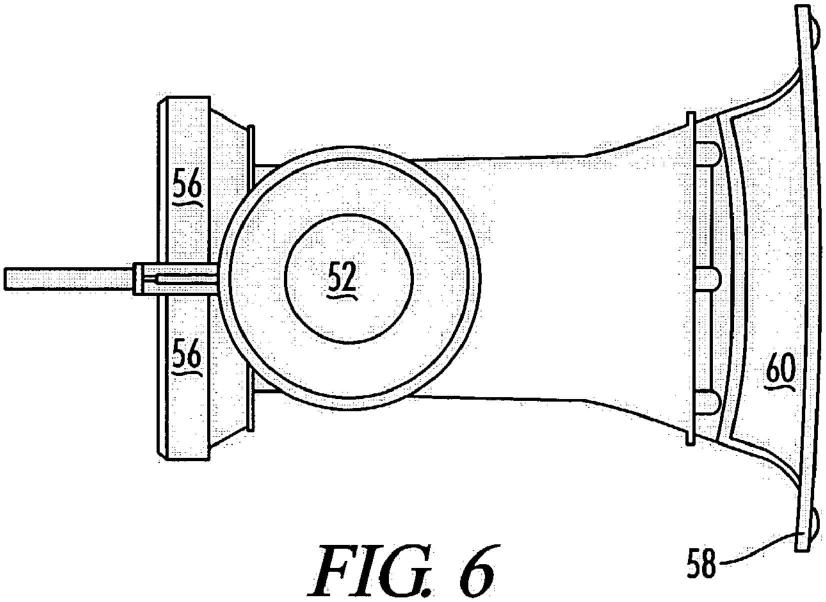
FIG. 6 is a side view of the horn assembly of FIG. 5.
Figure 7:
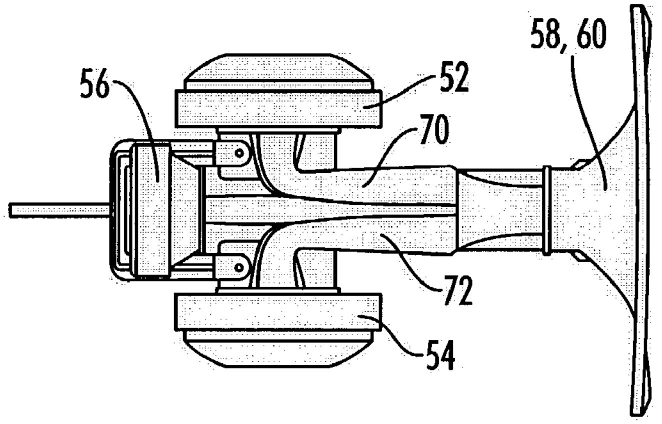
FIG. 7 is a top view of the horn assembly of FIG. 5.
Figure 8:
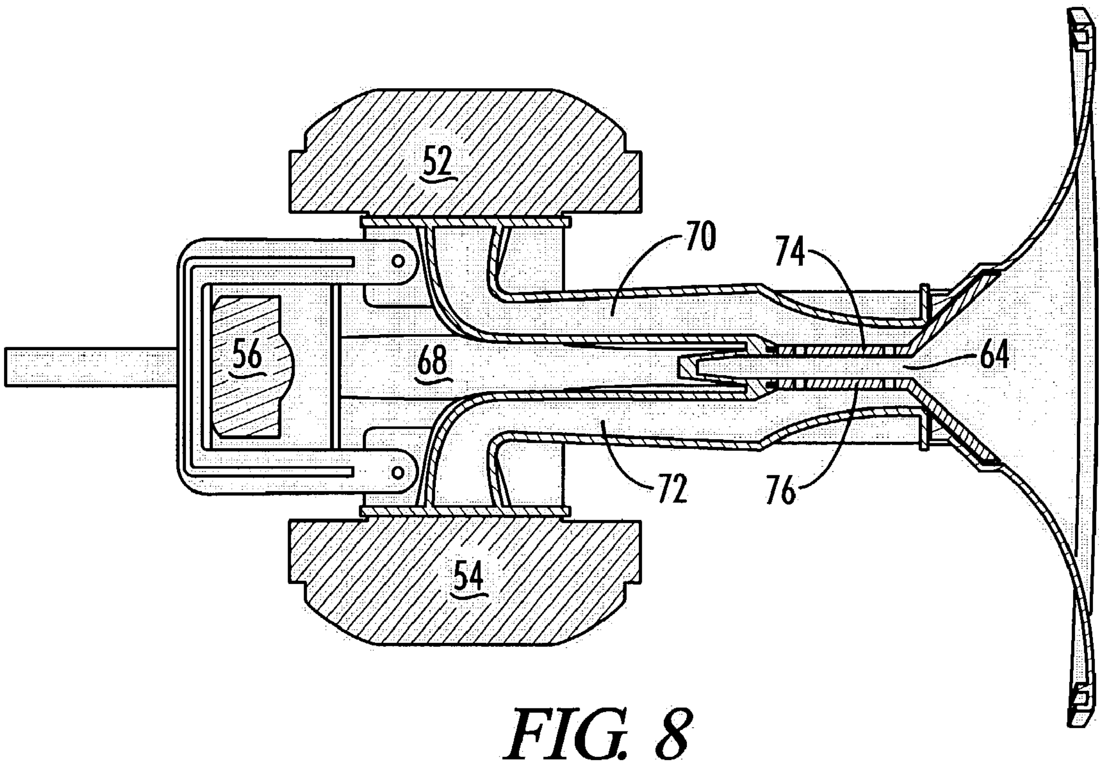
FIG. 8 is a cross sectional top view of the horn assembly of FIG. 5.
Figure 9:
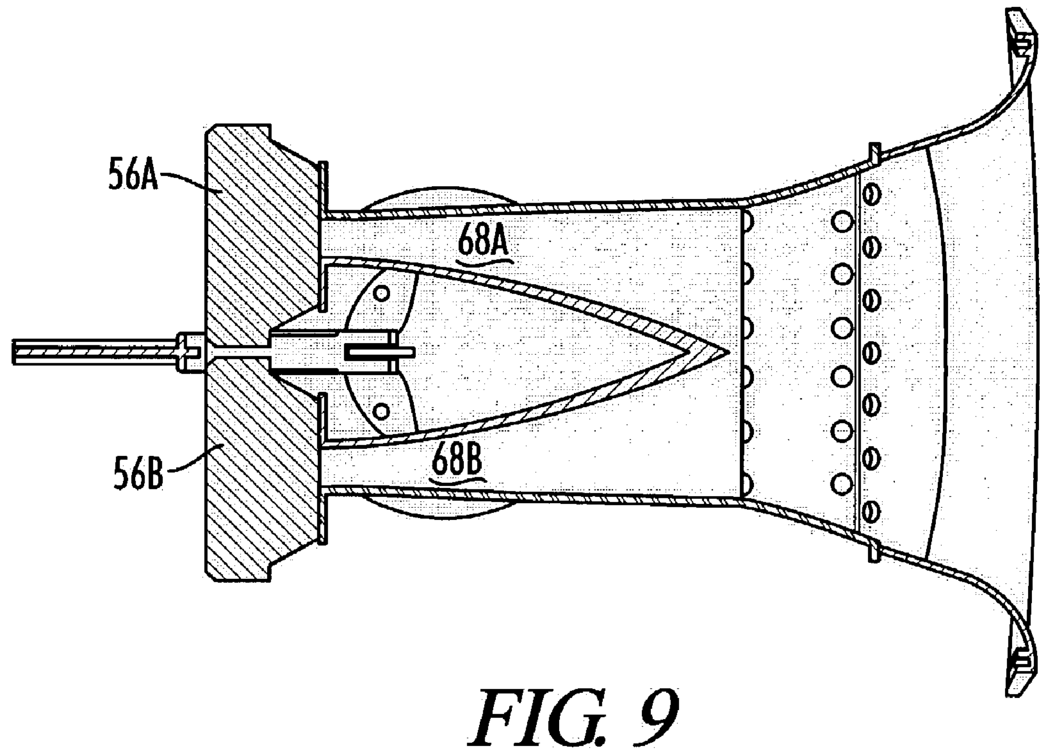
FIG. 9 is a side cross sectional view of the horn assembly of FIG. 5.
Figure 10:
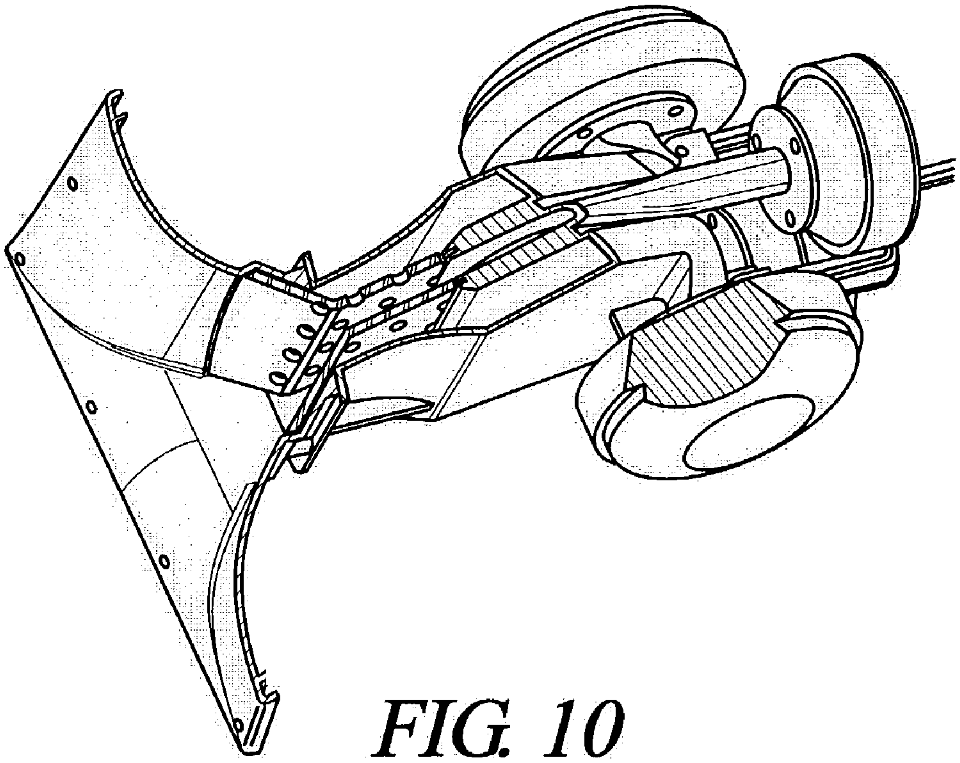
FIG. 10 is a perspective partially cut away view of the horn assembly of FIG. 5.
Figure 11:
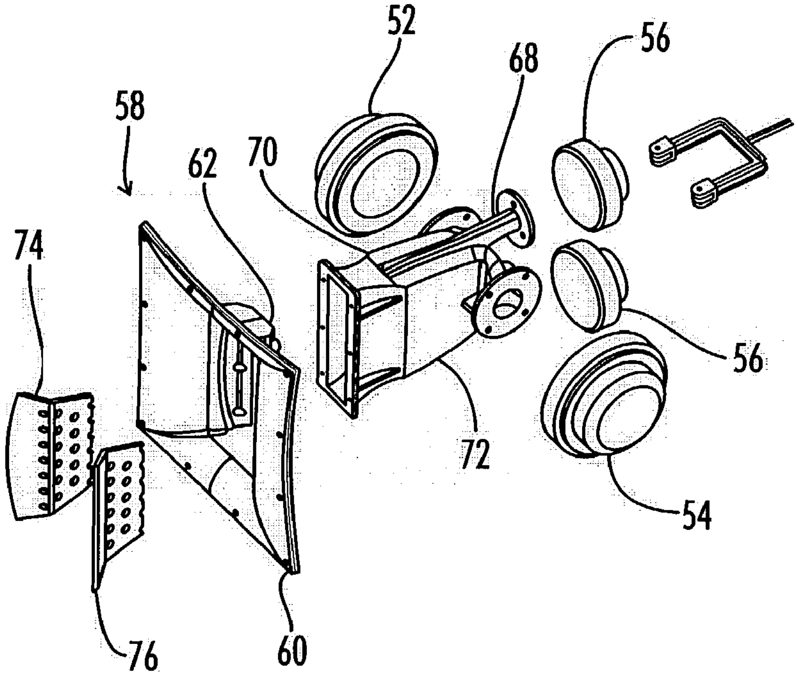
FIG. 11 is an exploded view of the horn assembly of FIG. 5.

FIG. 4 illustrates an alternative embodiment of the invention, sometimes referred to as a "quad horn", system generally designated by the numeral 50. The horn system 50 includes first and second lower frequency sources 52 and 54, and two higher frequency sources such as 56. A horn 58 includes a bell 60 and an entrance slot 62, which as further described below will effectively have a narrower higher frequency slot width 64 and a wider lower frequency slot width 66.

The higher frequency sound sources 56 are communicated with the entrance slot 62, and specifically with the narrower effective entrance slot 64 by a higher frequency throat section 68. The first and second lower frequency sound sources 52 and 54 are communicated with the entrance slot 62 by first and second lower frequency throat sections 70 and 72 which are disposed on opposite sides of the higher frequency throat section 68.

First and second perforated plate type acoustic filters 74 and 76 are located between each of the first and second lower frequency throat sections 70 and 72 and the higher frequency throat section 68. It is the two low frequency filters 74 and 76 which effective define the narrower effective entrance slot 64 into the horn 58 for the higher frequency sounds. Since the acoustic filters 74 and 76 are transparent to the lower frequency sounds, however, the lower frequency sounds have a wider effective entrance slot 66.

Thus, in the embodiment of FIG. 4, the two acoustic filters 74 and 76 essentially form an extension of the horn at the inlet slot 62 to the higher frequency throat section 68. The advantage is that the diffraction slot 62 is effectively narrow such as 64 for the higher frequencies, and is effectively wider such as 66 for the lower frequencies. This is an advantage because the width of the entrance slot should be proportional to the highest frequency to be diffracted. This arrangement also leads to a more effective flare rate for each frequency range for their respective throat sections and also provides symmetrical dispersion patterns for the two frequency ranges.

In both the embodiments of FIGS. 3 and 4, the design lends itself to equalizing the time delay from the two different range drivers, which is an advantage.

FIGS. 5-11 show various assembled, cut away and exploded views of the quad horn apparatus of FIG. 4, wherein the part numbers of FIG. 4 are utilized to identify the elements on FIGS. 5-11.

Figure 14:
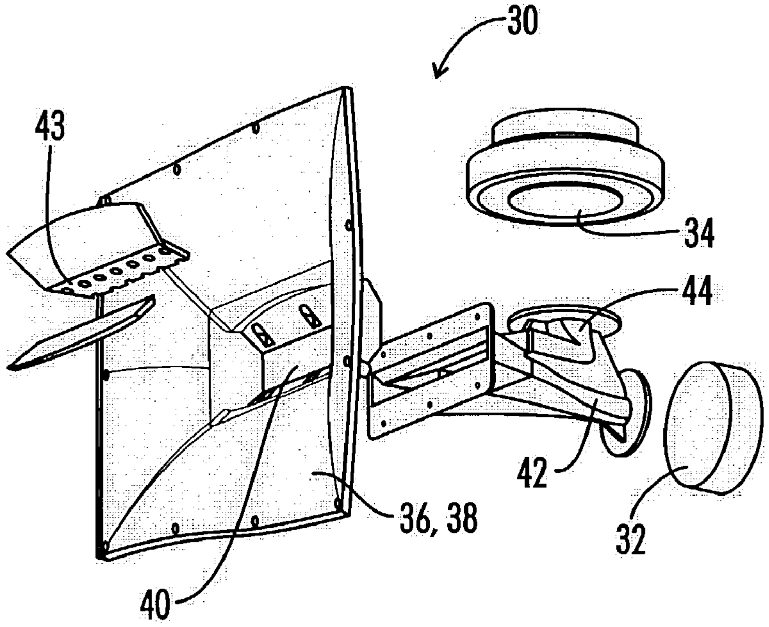
FIG. 14 is an exploded view of the dual horn assembly of FIG. 3.

FIG. 14 is an exploded view of the dual horn apparatus of FIG. 3, wherein the part numbers of FIG. 3 are utilized.

Figure 12:
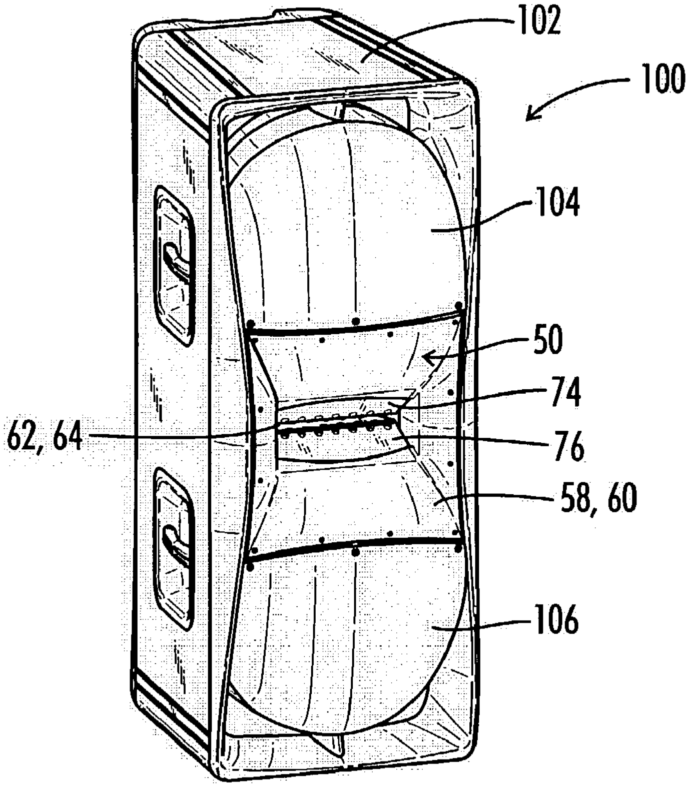
FIG. 12 is an assembled view of a three-way speaker system including the horn assembly of FIG. 5.

FIG. 12 shows a three-way speaker system 100 having a cabinet 102 within which the horn system 50 of FIGS. 5-11 is mounted.

As will be understood by those skilled in the art, in addition to the higher frequency "tweeter" speakers 56, and the lower frequency "mid-range" speakers 52 and 54 of horn system 50, the speaker system 100 will include large conventional bass or woofer speakers located behind decorative panels 104 and 106.

Figure 13:
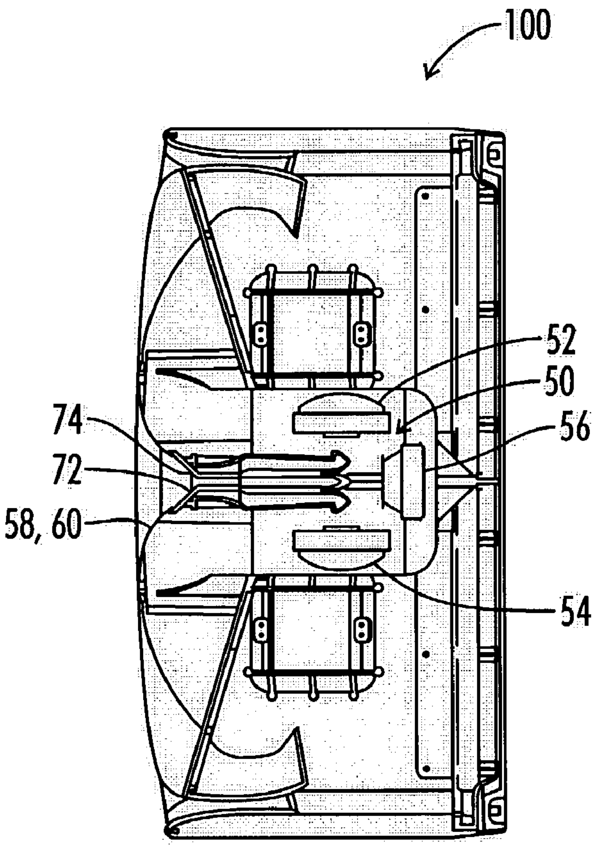
FIG. 13 is an elevation cross section view of the speaker system of FIG. 12 showing further interior details of the horn assembly of FIG. 5.

FIG. 13 is a right side elevation cut away view of the speaker system 100 of FIG. 12. The horn assembly 50 of FIGS. 5-11 is shown in place therein.

Figure 15:
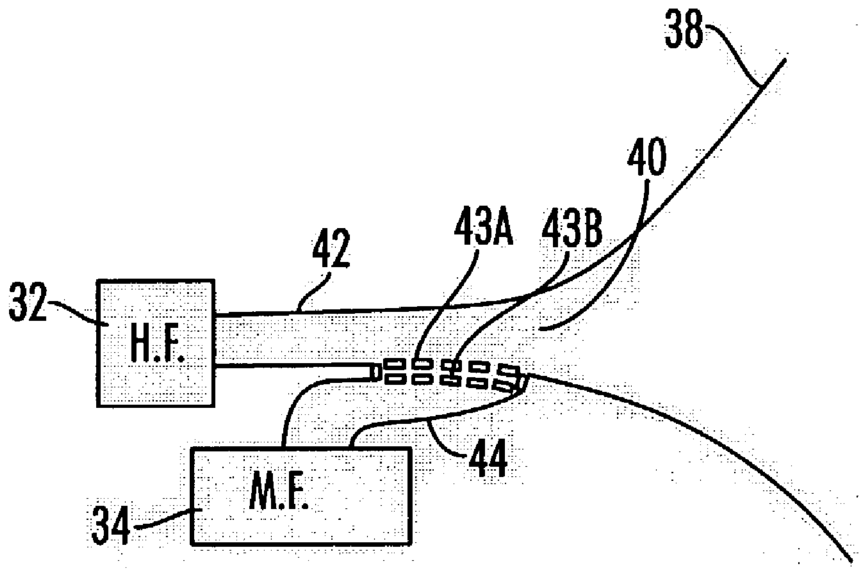
FIG. 15 is a schematic illustration of an alternative embodiment of a dual horn having two spaced perforated plate acoustic filters which comprise a three pole filter.
Figure 16:
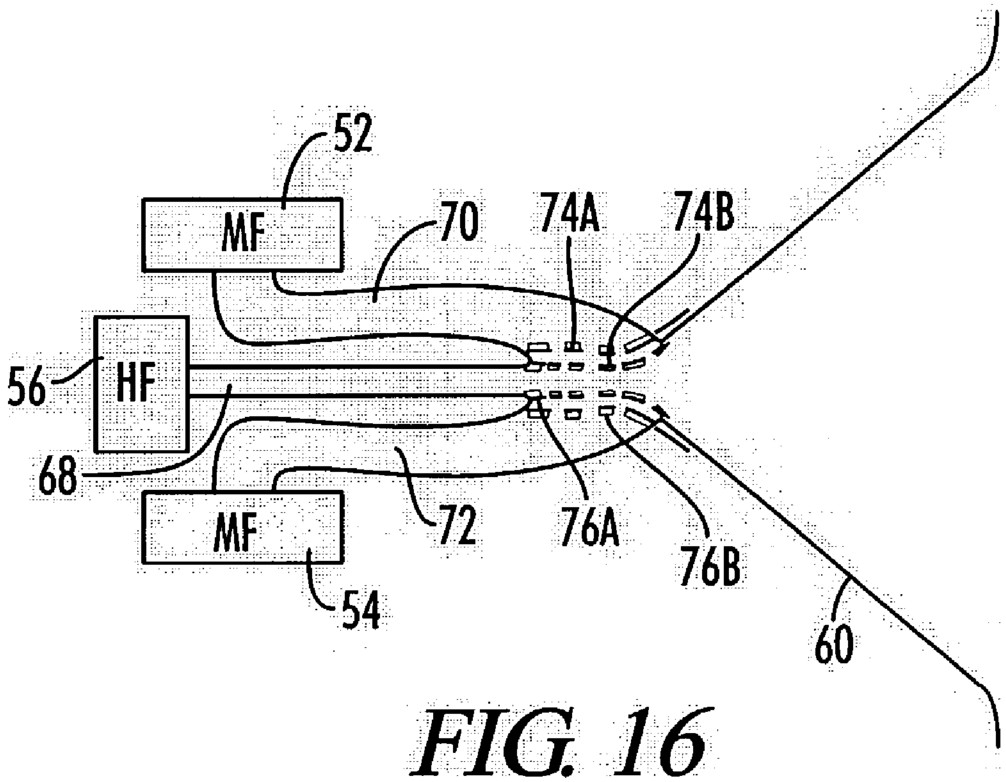
FIG. 16 is a schematic illustration of an alternative embodiment of a quad horn, each lower frequency source of which has two spaced perforated plate acoustic filters associated therewith.

FIGS. 15 and 16 schematically illustrate alternative embodiments of dual and quad horns, respectively, each of which utilizes acoustic filters comprising two spaced perforated plates. In FIG. 15 the two spaced perforated plates are designated as 43A and 43B. In FIG. 16, the first pair of plates is designated as 74A and 74B, and the second pair is designated as 76A and 76B. Such a spaced plate filter may be referred to as a "3 pole" filter. The single plate filters may be referred to as "single pole" filters.

The advantage of using two spaced perforated plates is that the filter has a sharper cutoff slope. The single pole filters of FIGS. 3 and 4 have a 20 dB per frequency decade slope above the crossover frequency, whereas the three pole filters of FIGS. 15 and 16 are 60 dB per decade.

Figure 20:
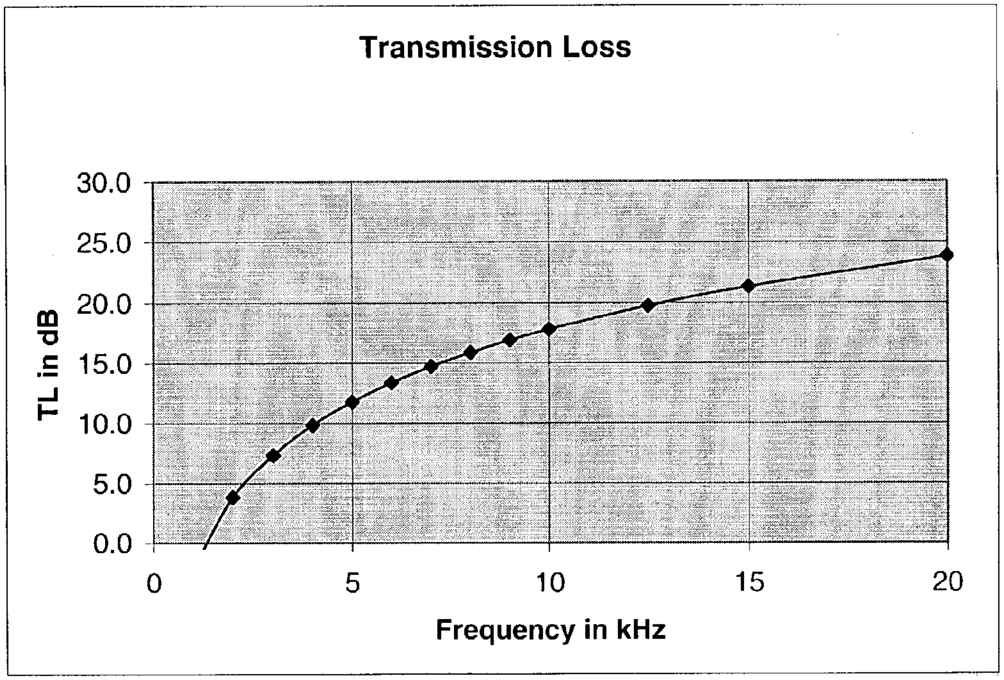
FIG. 20 is a graphical representation of the transmission loss of a suitable acoustic filter.
Figure 21A:
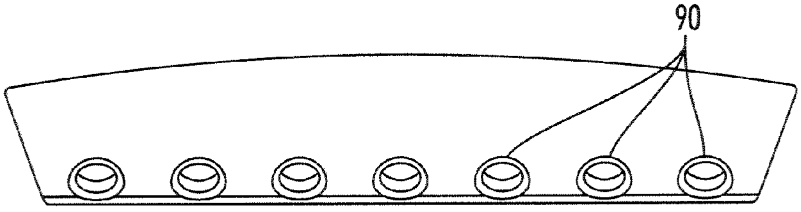
FIG. 21A shows a top view of one embodiment of a perforated filter.
Figure 21E:
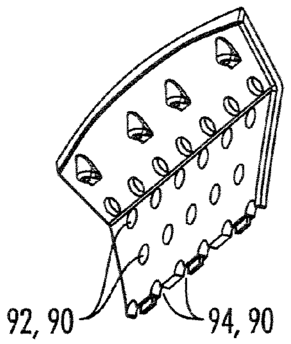
FIG. 21E shows a perspective view of the embodiment of the perforated filter shown in FIGS. 21A-21D.
Figure 21B:
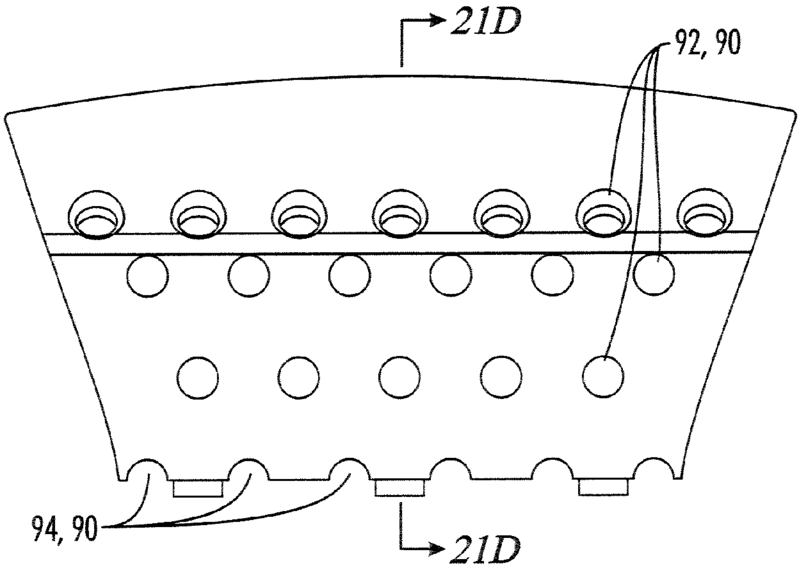
FIG. 21B shows a front view of the embodiment of the perforated filter shown in FIG. 21A.
Figure 21D:
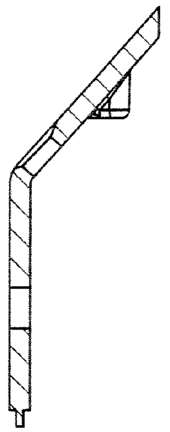
FIG. 21D shows a side view of the embodiment of the perforated filter shown in FIGS. 21A-21C
Figure 21C:
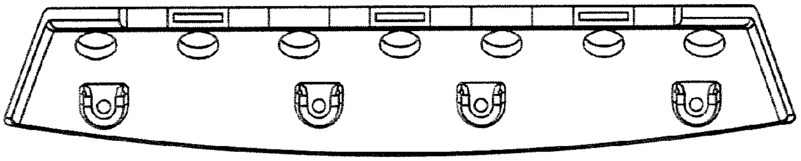
FIG. 21C shows a bottom view of the embodiment of the perforated filter shown in FIGS. 21A-21B.
Figure 22A:
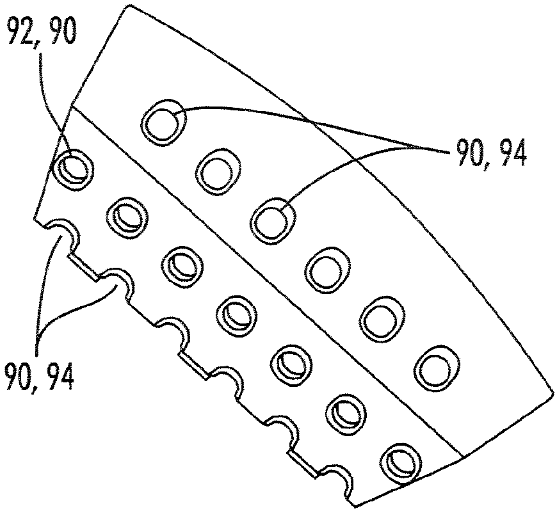
FIG. 22A shows a top view of an alternate embodiment of a perforated filter.
Figure 22F:
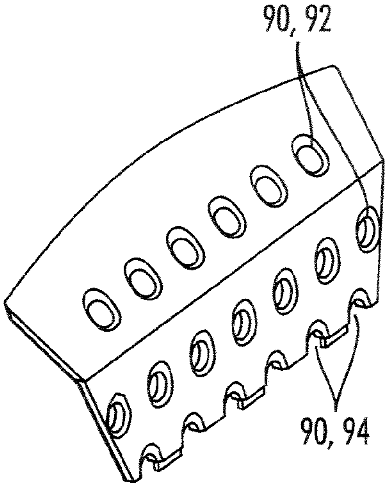
FIG. 22F shows a perspective view of the embodiment of the perforated filter shown in FIGS. 22A-22E.
Figure 22B:
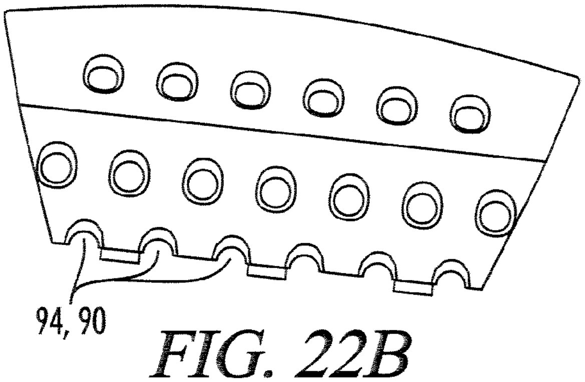
FIG. 22B shows a front view of the embodiment of the perforated filter shown in FIG. 22A.
Figure 22D:
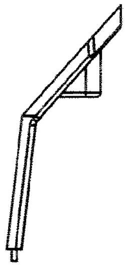
FIG. 22D shows a side view of the embodiment of the perforated filter shown in FIGS. 22A-22C
Figure 22C:
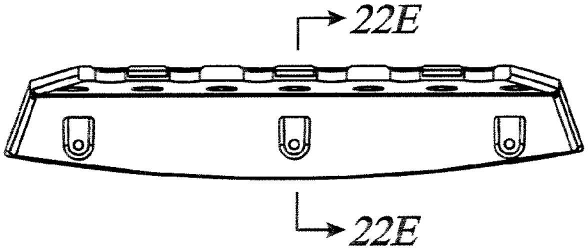
FIG. 22C shows a bottom view of the embodiment of the perforated filter shown in FIGS. 22A-22B.
Figure 22E:
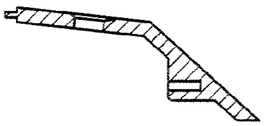
FIG. 22E shows a side view of the embodiment of the perforated filter shown in FIGS. 22A-22D.
Figure 23A:
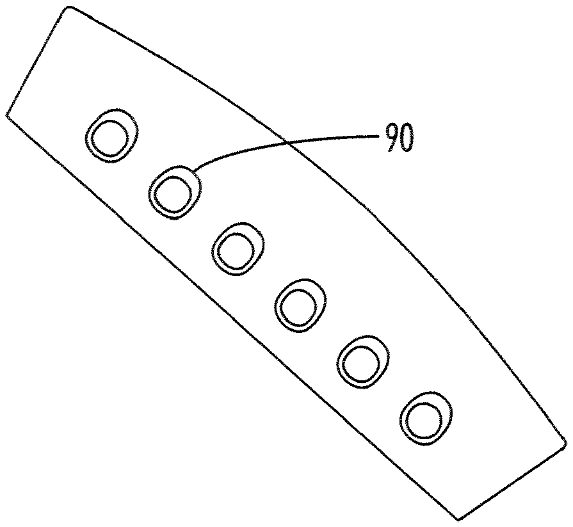
FIG. 23A shows a top view of another alternate embodiment of a perforated filter.
Figure 23F:
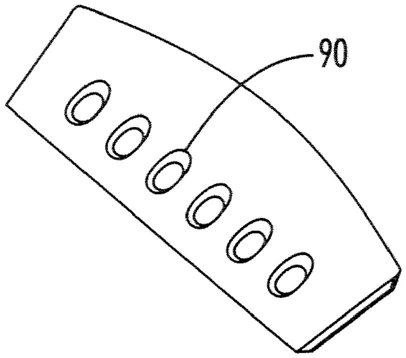
FIG. 23F shows a perspective view of the embodiment of the perforated filter shown in FIGS. 23A-23E.
Figure 23B:
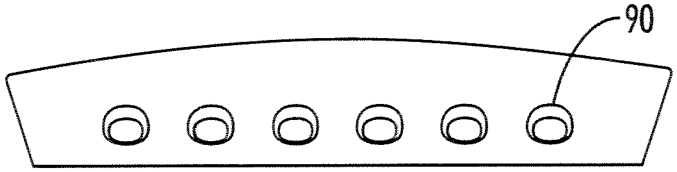
FIG. 23B shows a front view of the embodiment of the perforated filter shown in FIG. 23A.
Figure 23D:
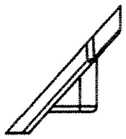
FIG. 23D shows a side view of the embodiment of the perforated filter shown in FIGS. 23A-23C
Figure 23C:
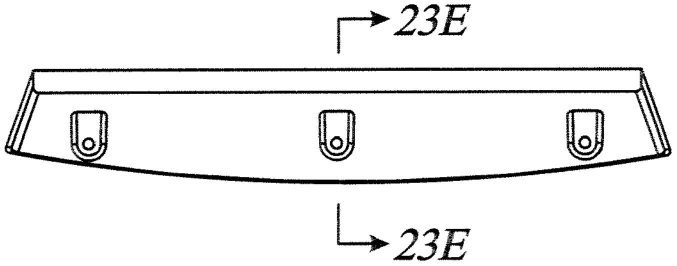
FIG. 23C shows a bottom view of the embodiment of the perforated filter shown in FIGS. 23A-23B.
Figure 23E:
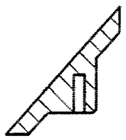
FIG. 23E shows a side view of the embodiment of the perforated filter shown in FIGS. 23A-23D.

The acoustic filter 43, 74, or 76 can be comprised of several different patterns of perforations within the plate. Calculations were performed to predict the performance of an acoustic filter. The transmission loss of a suitable acoustic filter 43, 74, or 76 is shown in FIG. 20. This transmission loss was derived from a single perforated plate 0.25 inches in thickness. This plate had 0.5 inch diameter round holes on one (1) inch, 60 degree staggered centers. Some empirical adjustments were made to obtain the desired performance. In a preferred embodiment, the spacing between holes of an acoustic filter 43, 74, or 76 is 1.25 inches.

FIGS. 21A-23F show three embodiments of acoustic filters 43, 74, or 76 suitable for use in the horn assembly 30. FIG. 21A-21E show a perforated filter having four rows of openings 90 traversing the acoustic filter. Three of these rows have circular openings 92, while the fourth row has semi-circular openings 94.

FIG. 22A-22E show a perforated filter having three rows of openings traversing the acoustic filter. Two of these rows have circular openings 92, while the third row has semi-circular openings 94. The openings located after the bend can be a row of decorative circular depressions if not acoustically needed by the horn assembly 30. FIG. 23A-23F show a perforated filter having one rows of circular openings 92 traversing the acoustic filter.

Other embodiments that vary the size, location, number and shape of the openings, or holes, of an acoustic filter should be readily apparent to one skilled in the art upon a reading of this disclose.

Thus, although there have been described particular embodiments of the present invention of a new and useful Dual Range Horn With Acoustic Crossover, it is not intended that such references be construed as limitations upon the scope of this invention except as set forth in the following claims.

What is claimed is:

1. A horn apparatus, comprising:

a horn having a bell and an entrance slot;

a higher frequency source;

a lower frequency source;

a higher frequency throat connecting the higher frequency source to the entrance slot of the horn;

a lower frequency throat connecting the lower frequency source to the entrance slot of the horn; and an acoustic filter interposed between the higher frequency throat and the lower frequency throat, upstream of the entrance slot of the horn, the acoustic filter being positioned so that sound passing through the lower frequency throat from the lower frequency source cannot combine with sound from the higher frequency source until after the sound from the lower frequency source passes through the acoustic filter.

2. The apparatus of claim 1, wherein the acoustic filter comprises an acoustic crossover.

3. The apparatus of claim 2, wherein the higher and lower frequency throats have different exponential flare rates.

4. The apparatus of claim 1, wherein the higher and lower frequency throats have different exponential flare rates.

5. The apparatus of claim 1, wherein the acoustic filter is a low pass filter.

6. The apparatus of claim 1, wherein the acoustic filter includes a perforated plate extending across the lower frequency throat.

7. The apparatus of claim 1, further comprising:

a second lower frequency source;

a second lower frequency throat connecting the second lower frequency source to the entrance slot of the horn; and a second acoustic filter interposed between the second lower frequency throat and the higher frequency throat.

8. The apparatus of claim 7, wherein the first and second acoustic filters are on opposite sides of the higher frequency throat.

9. The apparatus of claim 1, wherein the acoustic filter comprises two spaced perforated plates extending across the lower frequency throat.

10. The apparatus of claim 1, wherein the acoustic filter is positioned to establish a first effective entrance slot for the higher frequency and a second effective entrance slot for the lower frequency, wherein the first effective entrance slot is narrower than the second effective entrance slot.

11. The apparatus of claim 10, wherein widths of the first effective entrance slot and second effective entrance slots are proportional to the wave length of the frequency traversing each slot.

12. The apparatus of claim 1, wherein the acoustic filter includes a bent perforated plate having an extension merging into the bell of the horn.

13. The apparatus of claim 1, wherein each frequency has a substantially identical dispersion pattern from the horn.

14. The apparatus of claim 1, wherein the low and high frequency throats are similar in length for both of the frequency sources so that the higher frequency source and the lower frequency source have the same effective delay.

15. A horn assembly, comprising:

a horn having a contoured expansion and an entrance opening;

a higher frequency source;

a lower frequency source;

a higher frequency throat connecting the higher frequency source to the entrance opening of the horn, the higher frequency throat being located centrally relative to and communicating openly with the entrance opening of the horn, the higher frequency throat having a side;

a lower frequency throat connecting the lower frequency source to the side of the higher frequency throat upstream of the entrance opening of the horn; and an acoustic filter comprising a perforated guide interposed between the higher frequency throat and the lower frequency throat, the perforated guide being positioned so that sound energy from the lower frequency source must pass through the perforated guide to enter the higher frequency throat.

16. The assembly of claim 15, wherein the perforated guide includes openings sized to allow the lower frequency to traverse the perforated guide.

17. The assembly of claim 15, wherein the perforated guide directs the higher frequency into the horn.

18. The assembly of claim 15, wherein the perforated guide includes an extension shaped to merge into the contoured expansion of the horn.

19. A horn assembly, comprising:

a horn having a contoured expansion and an entrance opening;

a higher frequency source;

a first passage connecting the higher frequency source to the entrance opening of the horn;

a first lower frequency source a first lower frequency passage connecting the first lower frequency source to the entrance opening of the horn;

a second lower frequency source;

a second lower frequency passage connecting the second lower frequency source to the entrance opening of the horn;

a first perforated guide interposed between the higher frequency passage and the first lower frequency throat, upstream of the entrance opening of the horn; and a second perforated guide interposed between the higher frequency passage and the second lower frequency passage, upstream of the entrance opening of the horn, wherein the first and second perforated guides are positioned on opposite sides of the higher frequency passage.

20. The assembly of claim 19, wherein the first and second perforated guides include extensions that blend into the contoured expansion of the horn.

21. A horn apparatus, comprising:

a horn having a bell and an entrance slot;

a higher frequency source;

a lower frequency source;

a higher frequency throat connecting the higher frequency source to the entrance slot of the horn;

a lower frequency throat connecting the lower frequency source to the entrance slot of the horn;

an acoustic filter interposed between the higher frequency throat and the lower frequency throat, upstream of the entrance slot of the horn a second lower frequency source;

a second lower frequency throat connecting the second lower frequency source to the entrance slot of the horn; and a second acoustic filter interposed between the second lower frequency throat and the higher frequency throat.

22. The apparatus of claim 21, wherein the first and second acoustic filters are on opposite sides of the higher frequency throat.

* * * * *